United States Patent [19]

Brault

[11] Patent Number: 4,613,924

[45] Date of Patent: Sep. 23, 1986

[54] PRINTED CARD WITH IMPRESSIONS

[75] Inventor: Roland Brault, Antony, France

[73] Assignee: Thomson-CSF, Paris, France

[21] Appl. No.: 671,093

[22] Filed: Nov. 13, 1984

[30] Foreign Application Priority Data

Nov. 15, 1983 [FR] France .................. 83 18133

[51] Int. Cl.⁴ .............................................. H05K 1/14
[52] U.S. Cl. ................................... 361/403; 174/68.5; 361/406; 361/414
[58] Field of Search ............... 174/68.5; 361/414, 403, 361/406

[56] References Cited

U.S. PATENT DOCUMENTS

| | | | |
|---|---|---|---|
| 3,786,172 | 1/1974 | Conley | 174/68.5 |
| 3,917,984 | 11/1975 | Kong | 174/68.5 X |
| 3,923,359 | 12/1975 | Newsam | 174/68.5 X |
| 4,138,784 | 2/1979 | Nicholson | 174/68.5 X |
| 4,150,421 | 4/1979 | Nishihara et al. | 174/68.5 X |
| 4,159,508 | 6/1979 | Ida et al. | 361/414 X |
| 4,242,720 | 12/1980 | Moore | 361/414 |
| 4,330,684 | 5/1982 | Hayward . | |
| 4,414,741 | 11/1983 | Holt | 174/68.5 X |
| 4,494,172 | 1/1985 | Leary | 361/400 |
| 4,524,239 | 6/1985 | Rouge | 361/414 X |
| 4,524,240 | 6/1985 | Stock et al. | 174/68.5 |

FOREIGN PATENT DOCUMENTS 1126954 4/1962 Fed. Rep. of Germany .
2327530 12/1974 Fed. Rep. of Germany .

Primary Examiner—R. R. Kucia
Attorney, Agent, or Firm—Cushman, Darby and Cushman

[57] ABSTRACT

A printed card with impressions comprising several rows of conducting holes spaced apart by a multiple of a constant pitch and disposed in a repetitive pattern, each conducting hole being connected to a wiring stud provided on the wiring face within the pattern. Furthermore, the holes of some adjacent rows are connected to wiring tracks provided on the component face of the card and the holes of other adjacent rows are connected together and connected to the same wiring stud.

6 Claims, 6 Drawing Figures

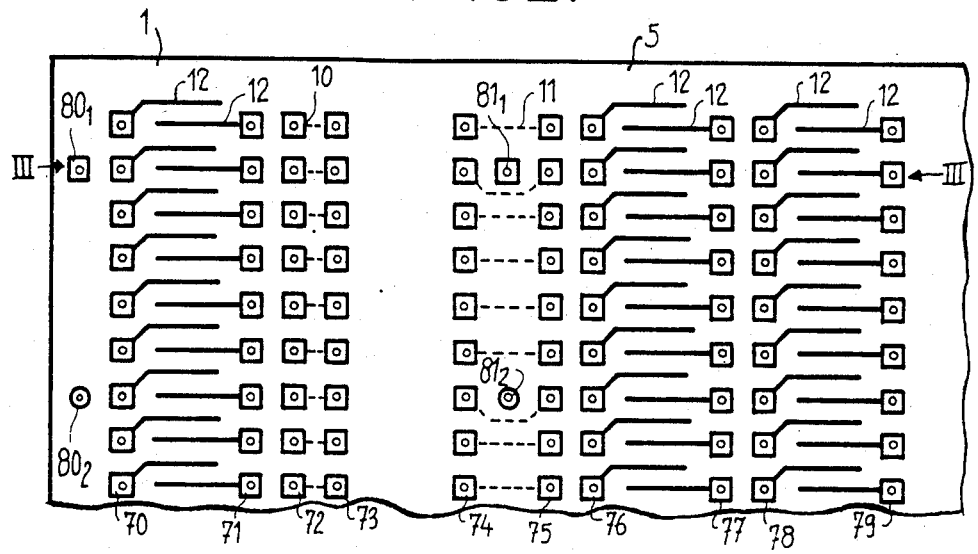
FIG_1
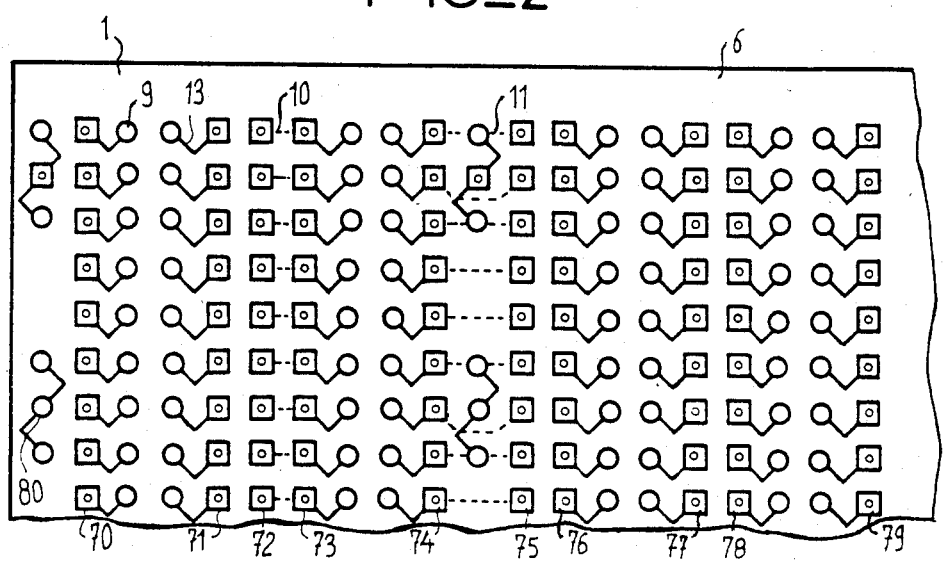
FIG_2

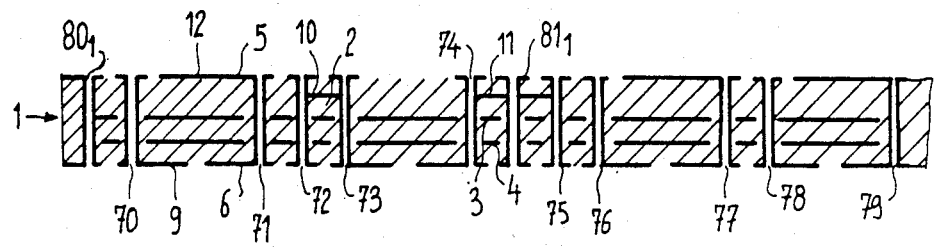
FIG_3
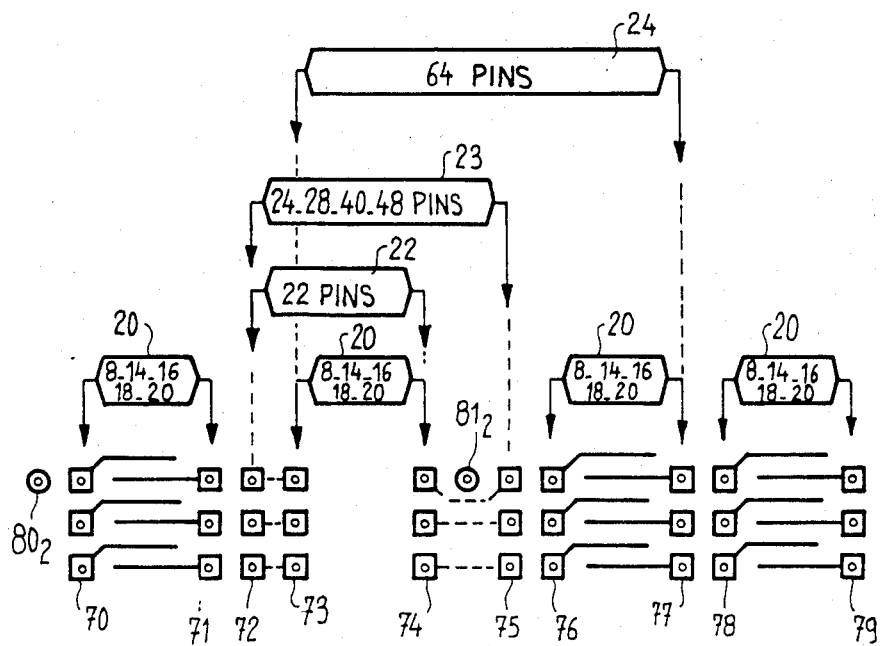
FIG_4

FIG_5
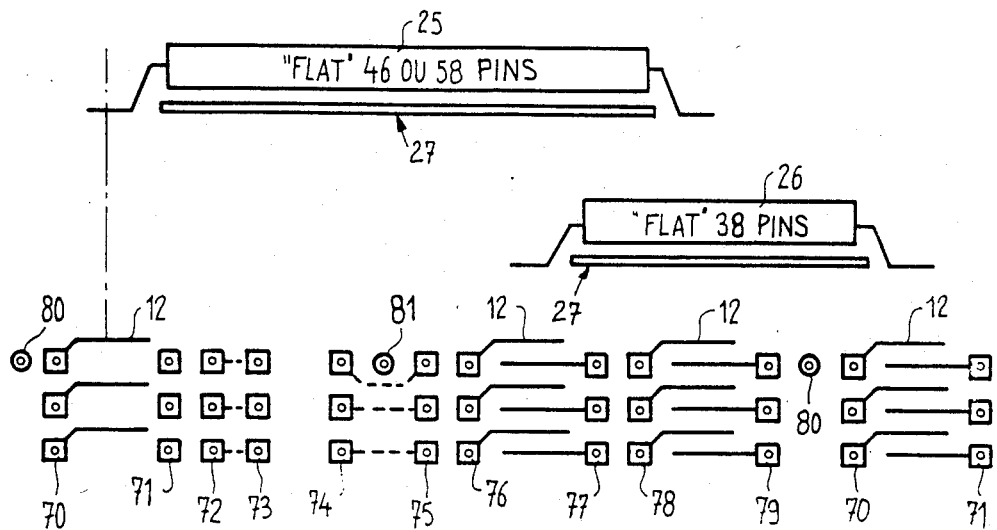
FIG_6
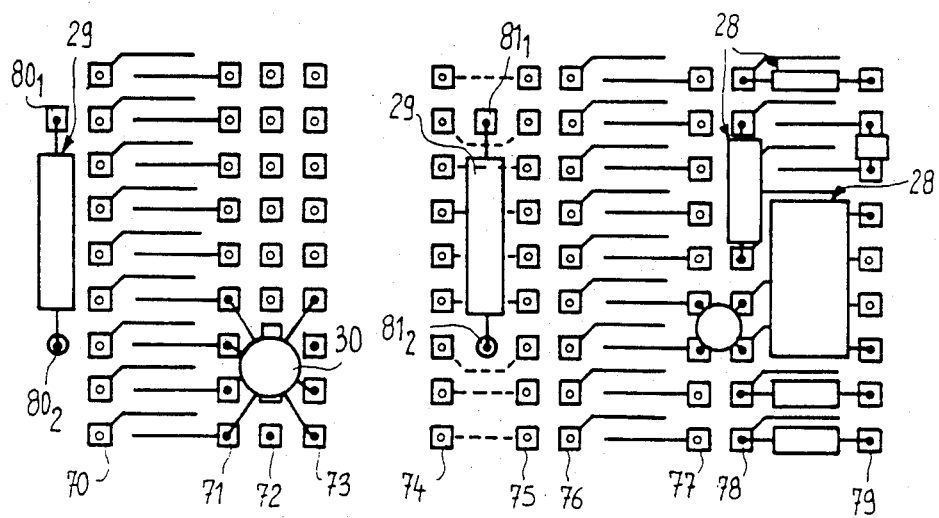

PRINTED CARD WITH IMPRESSIONS

BACKGROUND OF THE INVENTION

1. Field of the Invention

The present invention relates generally to a card for use in fabricating a prototype of an electronic circuit. More specifically, the invention provides a printed card having a pattern of holes therein for receiving packaged circuits and/or discrete components.

2. Description of the Prior Art

For prototype electronics circuits, multilayer printed circuits are not suitable because of the considerable time required for designing same and the great difficulty in making modifications. Different techniques are used for forming printed circuits at the model or prototype stage. These techniques use printed cards with impressions requiring a specific layout or not and different types of wiring such as traditional wiring, wrapping, multiwire or wiring called "ema-fil." However, these techniques present numerous disadvantages.

Thus, traditional wiring which may be carried out on a printed card having pattern of holes without specific layout, involves more especially a considerable waste of space due to the requirement of having holes for inserting the wires, the existence of "strands" resulting in coupling problems for high frequency signals, the impossibility of soldering directly on the card hybrid circuits of the flat case type in the positions provided for cases with a double row of connections or DIP cases.

The so called "ema-fil" wiring requires for each diagram a specific layout of the impressions on the printed card which results in relatively long construction times.

SUMMARY OF THE INVENTION

The aim of the present invention is therefore to overcome these disadvantages by providing a new printed card (circuit board) structure having pattern of holes which allows the following results to be obtained:

- minimizing of the time required for constructing the printed circuit;
- use alike of several types of DIP cases are flat cases;
- provision of a high circuit density to the dm$^2$;
- very low wiring volume;
- ease of making modifications and improvements;
- possibility of automatic wiring.

The present invention provides a printed card with a pattern of holes having a component face and a wiring face, and further comprising several rows of conducting holes spaced apart by a multiple of a constant pitch and disposed in a repetitive pattern, each conducting hole being connected to a conducting wiring stud provided on the wiring face inside the pattern.

BRIEF DESCRIPTION OF THE DRAWINGS

Other features and advantages of the present invention will appear from the following description of a preferred embodiment with reference to the accompanying drawings in which:

FIG. 1 is a partially exploded top view of a printed card with impressions according to the present invention;

FIG. 2 is a partially exploded bottom view of the card of FIG. 1;

FIG. 3 is a sectional view through III—III of FIG. 1;

FIG. 4 is a top view showing the different possibilities of layout for DIL cases;

FIG. 5 is a view similar to that of FIG. 4 for flat cases, and

FIG. 6 is a view similar to that of FIG. 4 for discrete components.

DESCRIPTION OF THE PREFERRED EMBODIMENTS

In the Figures, the same references designate the same elements but for the sake of clarity the sizes and proportions of the different elements have not been respected.

FIGS. 1 to 3 show a preferred embodiment of a printed card with a pattern of holes in accordance with the present invention. As can be seen in FIG. 3, the printed card with a pattern of holes is a multilayer card comprising five conducting layers, namely three internal layers 2, 3, 4 and two external layers 5, 6, namely the component face and the wiring face.

In accordance with the present invention, the printed card 1 has several rows 70 to 79, 80 and 81 of conducting holes formed preferably by metallized holes. Different rows of conducting holes are spaced from one another by a multiple of predetermined pitch or step such as, for example, of 2.54 mm and are disposed in a repetitive pattern. The pitch of 2.54 mm was chosen to correspond to the present dimensions of the DIP cases and the flat cases which are to be mounted on printed cards. The repetitive pattern of the embodiment shown is a pattern formed over 20 steps of 2.54 mm. It is essentially formed by ten rows 70 to 79 of holes intended to receive the pins of the circuits and by two rows 80 and 81 of holes for the supply and ground connections. The rows of holes intended to receive the pins of the circuits are formed from holes spaced apart by 2.54 mm whereas the rows of holes intended for the supply and decoupling are formed of holes $80_1$, $80_2$ or $81_1$, $81_2$ spaced apart by five steps of 2.54 mm.

For receiving DIP cases of different widths, the metallized holes of some adjacent rows such as rows 72 and 73 or 74 and 75 are connected together by means of internal connections 10 and 11 formed on the second conducting layer 2. Similarly, for receiving the different flat cases, without waste of space, the holes of some adjacent rows such as rows 70 and 71, 76, 77, 78, 79 are connected to wiring tracks 12 provided on the component face 5 of card 1. The wiring tracks 12 of two adjacent rows of metallized holes are formed so as to be parallel to each other and spaced apart by a half pitch, namely 1.27 mm, for receiving hybrid circuits in flat cases whose pins are 1.27 mm apart Thus, the repetitive pattern of the embodiment shown is formed from a first row 80 of holes for the power supply and decoupling comprising a power supply hole $80_1$ connected to the power supply plane formed by the internal conducting layer 3 and a decoupling hole $80_2$ connected to the ground plane formed on the internal conducting layer 4. This row 80 of holes is spaced apart by a step from a first row 70 of holes intended to receive the pins of the different circuits or components. The holes of row 70 are each connected to a wiring track 12 for flat cases and this row is spaced by three pitches from the second row 71 whose holes are connected to a wiring track 12. At a distance of one pitch or step from row 71 of holes there is provided a third row 72 of holes. This row of holes 72 is itself spaced apart from row 73 of holes by a pitch. The holes of rows 72 and 73 are connected together by connections 10. Then, at a distance of three pitches, there is provided a fifth row 74 of holes whose holes are connected by connections 11 to the holes of a sixth row 75 of holes spaced apart by two pitches. Between rows 74 and 75 there is provided a second row of power supply and decoupling holes $81_1$, $81_2$ connected to the power supply plane and to the ground plane in the same way as the row of holes 80. Then at a pitch from row 75 of holes there is provided a row 76 of holes each connected to a wiring track 12. This row 76 of holes is spaced apart by a distance of two pitches from a row 77 whose holes are connected to a wiring track 12. The wiring tracks connected to the holes of rows 76 and 77 are parallel to each other and spaced apart by a pitch of 1.27 mm. A row 78 of holes is provided at a pitch from row 77. The holes of this row 78 are connected to a wiring track 12. This row is spaced by a distance of three pitches from a row 79 of holes, the holes of which are also connected to a wiring track 12, the wiring tracks of rows 78 and 79 being parallel to each other and spaced apart by half a pitch.

As shown in FIG. 2, each metallized hole is connected directly through a connection 13 or indirectly through internal connections 10, 11 to a wiring stud. The wiring studs are all disposed inside the above described pattern.

The above described repetitive pattern is repeated a number of times. In fact the number of holes in a row and the number of repetitive patterns are only limited by the format of the printed circuit card 1.

The above described printed card with impressions is constructed according to the usual manufacturing methods well known to a man skilled in the art. Consequently these manufacturing methods will not be described here.

With reference to FIGS. 4 to 6, the different layout possibilities will now be described which may be provided with the printed card with impressions in accordance with the present invention.

As shown in FIG. 4, it is possible to mount different types of DIP cases on the printed card with impressions of the present invention 1. Thus, as shown in FIG. 4 which relates to the layout of DIP cases, one pattern allows the insertion of:

four rows of DIP cases 20 having 8, 14, 16, 18, 20 pins of a width of three pitches, or else three rows of DIP cases 20 having 8, 14, 16, 18 or 20 pins and a row of DIP cases having 22 pins with a width of 4 pitches and a row of DIP cases 23 having 24, 28, 40, 48 pins with a width of six pitches, or else a row of cases DIP 20 and two rows of cases DIP 22;

two rows of DIP cases 20 and a row of DIL cases 23 or else two rows of DIP cases 20 and a row of DIL cases 24 having 64 pins with a width of nine pitches.

The insertion of DIP cases of different widths in a same position is made possible because the holes of certain pairs of rows 72, 73, 74, 75 are connected together by internal connections 10, 11.

As shown in FIG. 5, the printed card of the present invention allows certain hybrid circuits to be laid out in the form of flat cases whose pins are divided into two parallel rows with a pitch of 1.27 mm. The 25 or 46 or 58 pin flat cases as well as 26 to 38 pin flat cases are mounted on the component face 5 of the printed card so that their pins are in contact with the wiring tracks 12. An insulating plate 27 is provided between the flat cases and the component face 5 of the printed card.

As shown in FIG. 6, discrete elements such as decoupling capacities 29, resistors 28, transistors 30 or similar may also be laid out on the printed card of the present invention. The decoupling capacities 29 are more especially connected to the rows of holes 80, 81 connected to the power supply plane and to the ground plane.

Different lay out examples will now be given to show the advantages of the printed card of the present invention, in particular as far as the layout density is concerned. The following examples relate to cards with impressions of four $dm^2$ (286 by 138 mm). The usable surface is about 3.3 $dm^2$.

EXAMPLE 1

On this card the following DIP cases were laid out, the layout being given as the equivalent of 16 pin cases for comparison;

1 64-pin case equivalent to 9 16-pin-cases
10 24-pin cases equivalent to 28 16-pin cases
4 22-pin cases equivalent to 8 16-pin cases
22 14-pin cases equivalent to 19 16-pin cases,
31 16-pin cases equivalent to 31 16-pin cases,
26 20-pin cases equivalent to 32 16-pin cases,
1 18-pin case equivalent to 1 16-pin case.

This layout corresponds to a density of 38 16-pin equivalents to the $dm^2$.

EXAMPLE 2

18 22-pin cases equivalent to 36 16-pin cases,
11 14-pin cases equivalent to 9 16-pin cases,
49 16-pin cases equivalent to 49 16-pin cases,
13 16-pin cases equivalent to 16 16-pin cases,
7 positions available equivalent to 7 16-pin cases.

This layout corresponds to a density of 35 16-pin equivalents to the $dm^2$.

EXAMPLE 3

23 14-pin cases equivalent to 21 16-pin cases,
20 16-pin cases equivalent to 20 16-pin cases,
6 24-pin cases equivalent to 7 16-pin cases,
20 18-pin cases equivalent to 23 16-pin cases,
2 flat cases having 58 pins equivalent to 18 16-pin cases,
4 flat cases having 46 pins equivalent to 28 16-pin cases.

This layout corresponds to a density of 38 16-pin equivalents to the $dm^2$.

Generally, it may be considered that the printed card of the invention allows cards to be obtained exceeding a density of 30 16-pin equivalents to the $dm^2$. This density is comparable to the density provided by multilayer printed circuits.

The printed card with impressions in accordance with the present invention allows then circuits to be formed at the prototype or model stage rapidly and in the volume which the final equipment will occupy. The wiring technique used with this type of card is the "ema-fil" or possibly "muliwire" technique.

In the above description a printed card is used having five conducting layers, however it is obvious for a man skilled in the art that a printed card could be used having four conducting layers, the internal connections 10 and 11 being formed on the component face 5 of the printed card. It would even be possible, without departing from the spirit of the present invention, to form the printed card with a double printed card face.

Furthermore, the repetitive pattern allows a layout of great variety of DIP cases and hybrid circuits in the form of flat cases. However, this repetitive pattern may be adapted to other types of cases likely to be fixed to printed cards without departing from the spirit of the invention.

What is claimed is:

1. An electronic circuit card, comprising:
    a first external layer having a component face, a plurality of rows of conducting holes being formed therein, the rows being spaced apart by multiples of a predetermined constant pitch and disposed in a repetitive pattern;
    second external layer having a wiring face;
    at least two internal layers between said external layers;
    a plurality of wiring studs, provided on said wiring face, each conducting hole being electrically connected to at least one wiring stud; and
    a plurality of wiring tracks, provided on said component face, the holes of at least two adjacent rows being connected to respective wiring tracks.

2. A card according to claim 1 further comprising means for coupling at least one layer of said card to a power supply voltage to form a power supply layer and means for coupling at least one layer of said card to a power supply return to form a ground layer.

3. A card according to claim 2 wherein each pattern of holes includes at least one conducting hole coupled to said power supply layer and at least one conducting hole coupled to said ground layer.

4. A card according to claim 1 wherein corresponding holes of at least two adjacent rows are connected to the same wiring stud.

5. A card as claimed in claim 1, wherein the tracks of two adjacent rows are parallel and spaced apart by half a pitch.

6. A card as claimed in claim 1, wherein the holes of each row are spaced apart by a multiple of the constant pitch.

* * * * *